(12) United States Patent
Kitade

(10) Patent No.: US 6,340,823 B1
(45) Date of Patent: Jan. 22, 2002

(54) SEMICONDUCTOR WAFER HAVING A MULTI-TEST CIRCUIT, AND METHOD FOR MANUFACTURING A SEMICONDUCTOR DEVICE INCLUDING MULTI-TEST PROCESS

(75) Inventor: Osamu Kitade, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/215,200

(22) Filed: Dec. 18, 1998

(30) Foreign Application Priority Data

Jul. 17, 1998 (JP) ............................................. 10-203918

(51) Int. Cl.[7] ............................................. H01C 23/58
(52) U.S. Cl. ........................................ 257/48; 257/275
(58) Field of Search .................................... 257/48, 275

(56) References Cited

U.S. PATENT DOCUMENTS 5,457,400 A * 10/1995 Ahmad et al. ............... 324/763
5,477,062 A    12/1995 Natsume
5,898,186 A *  4/1999 Fransworth et al. ........... 257/48

FOREIGN PATENT DOCUMENTS

| JP | 4-75358   | 10/1992 |
| JP | 5-90362   | 9/1993  |
| JP | 5-275504  | 10/1993 |
| JP | 07-297244 | 10/1995 |
| JP | 08-304459 | 11/1996 |
| KR | 93-14871  | 7/1993  |

OTHER PUBLICATIONS

Laplante, Phillip, Comprehensive Dictionary of Electrical Engineering; pg. 485 (CRC 1999).*

* cited by examiner

Primary Examiner—Stephen D. Meier
(74) Attorney, Agent, or Firm—McDermott, Will & Emery

(57) ABSTRACT

There is described a semiconductor wafer suitable for efficiently testing a plurality of logic chips formed thereon without damaging input/output sections of the chips. A plurality of chips, a test circuit, and output pads are formed on a semiconductor wafer. A plurality of input pads of the test circuit are connected to terminals corresponding to all the chips by way of a test pattern. The chips are connected to the output pads by means of test patterns. All the chips are subjected to a test (or multi-test) through use of the test circuit and the output pads. The test circuit and the output pads are provided in the peripheral area of the semiconductor wafer.

6 Claims, 10 Drawing Sheets

SEMICONDUCTOR WAFER HAVING A MULTI-TEST CIRCUIT, AND METHOD FOR MANUFACTURING A SEMICONDUCTOR DEVICE INCLUDING MULTI-TEST PROCESS

BACKGROUND OF THE INVENTION

1. Field of the Invention

The present invention generally relates to a semiconductor wafer having a multi-test circuit and to a method for manufacturing a semiconductor device including a multi-test process, and more particularly, to a semiconductor wafer having a multi-test circuit suitable for efficiently checking a plurality of chips formed on a wafer and a method for manufacturing a semiconductor device including a multi-test process suitable for efficiently checking the chips.

2. Description of the Background Art

During the process of manufacturing a semiconductor device, chips are checked when being formed on a wafer. In such a conventional wafer inspection, there has been commonly employed a method of checking the function of one chip or four chips at a time by bringing an inspection stylus into contact with input/output pads of an individual chip.

In the conventional wafer inspection method, when the inspection stylus is not properly brought into contact with the input/output pads of the chip, the stylus is repeatedly brought into contact with the input/output pads until an upright position is obtained. In this case, the input/output pads of the chip may be damaged in the course of wafer inspection. Further, a method of checking one chip or four chips at one time, such as a conventional wafer inspection method, requires a vast amount of time to check all the chips. In this respect, the conventional wafer inspection method has hindered a reduction in the cost of a semiconductor device.

SUMMARY OF THE INVENTION

The present invention has been conceived to solve the foregoing drawback in the conventional wafer inspection method, and the primary object of the present invention is to provide a semiconductor wafer having a multi-test circuit capable of efficiently checking a plurality of logic chips formed on a semiconductor wafer without damaging input/output pads of the chips.

The above object of the present invention is achieved by a semiconductor wafer. The semiconductor wafer includes a plurality of chips and a multi-test circuit for the purpose of testing the plurality of chips. The multi-test circuit includes a test circuit including input pads connected to terminals of the plurality of chips. The multi-test circuit further includes a plurality of output pads connected to respective output terminals of the plurality of chips. The test circuit and the output pads are provided in the peripheral area of the semiconductor wafer.

Another object of the present invention is to provide a method for manufacturing a semiconductor device including a multi-test process effective in efficiently checking a plurality of logic chips formed on a semiconductor wafer without damaging the input/output pads of the chips.

The above object of the present invention is achieved by a method for manufacturing a semiconductor device including a multi-test process. The method includes a step for forming a plurality of chips on a semiconductor wafer. The method also includes a step for forming a test circuit and a plurality of output pads. The test circuit includes input pads to be connected to terminals of the plurality of chips. The plurality of output pads is connected to respective output terminals of the plurality of chips. The test circuit and the output pads are provided in the peripheral area of the semiconductor wafer. The method further includes a multi-test process for testing the plurality of chips through use of the test circuit and the output pads, and a step for separating the plurality of chips after the multi-test process.

Other objects and further features of the present invention will be apparent from the following detailed description when read in conjunction with the accompanying drawings.

DESCRIPTION OF THE PREFERRED EMBODIMENTS

Figure 1:
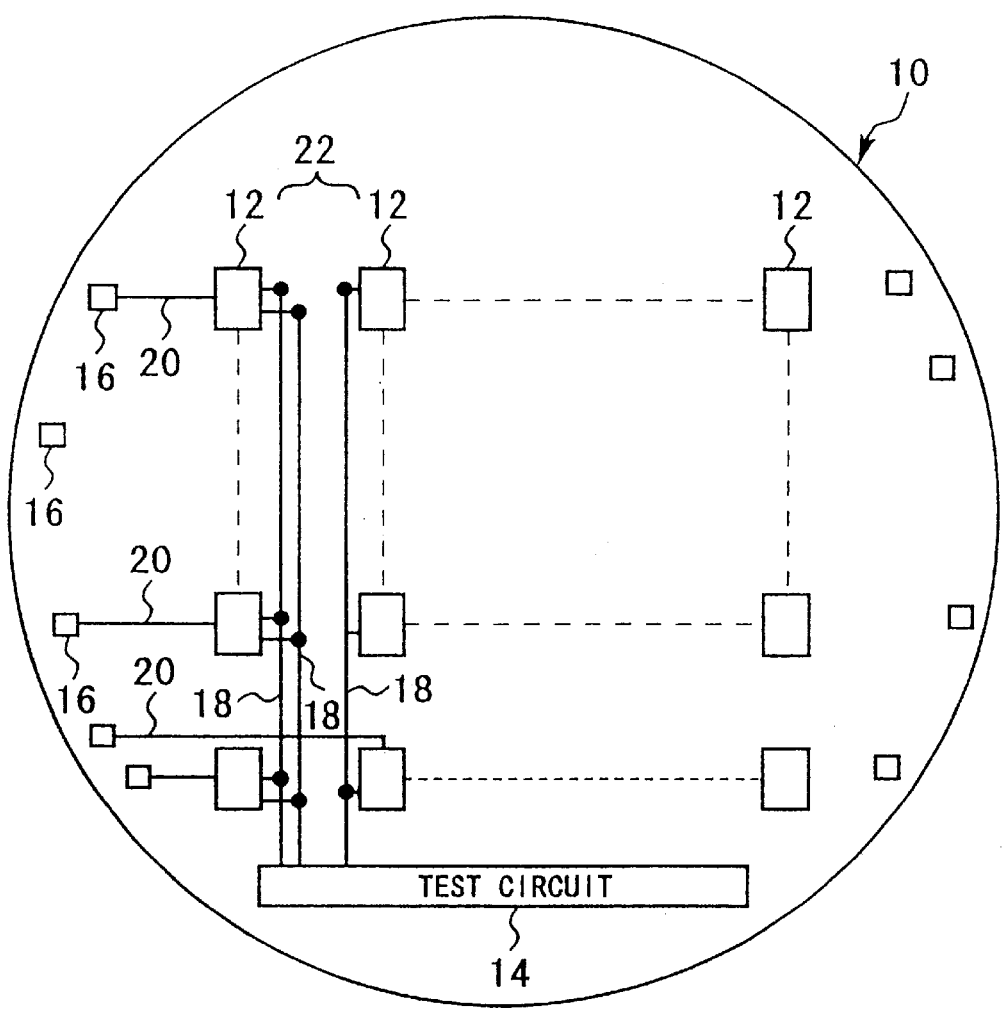
FIG. 1 is a plan view showing a semiconductor wafer according to a first embodiment of the present invention.

In the following, principles and embodiments of the present invention will be described with reference to the accompanying drawings. Elements which are common to all the drawings will be assigned the same reference numerals, and repetition of their explanations will be omitted.

First Embodiment

FIG. 1 is a plan view showing a semiconductor wafer 10 according to a first embodiment of the present invention. As shown in FIG. 1, a plurality of chips 12 are provided on the semiconductor wafer 10. Each of the chips 12 is a semiconductor device which performs an independent function. The following description applies to a case where the chips 12 serve as DRAM.

One test circuit 14 and a plurality of output pads 16 are provided on a peripheral portion of a semiconductor wafer 10. Each of the output pad 16 is provided so as to correspond to the individual chip 12. Further, the semiconductor wafer 10 is provided with a plurality of test wiring 18 for connecting the test circuit 14 with the respective chips 12 and a plurality of test patterns 20 for connecting the chips 12 to the respective output pads 16. Between the adjacent chips 12 is a scribe line region 22 which is used for separating the chips 12. The test wiring 18 is formed in the scribe line region 22.

Figure 2:
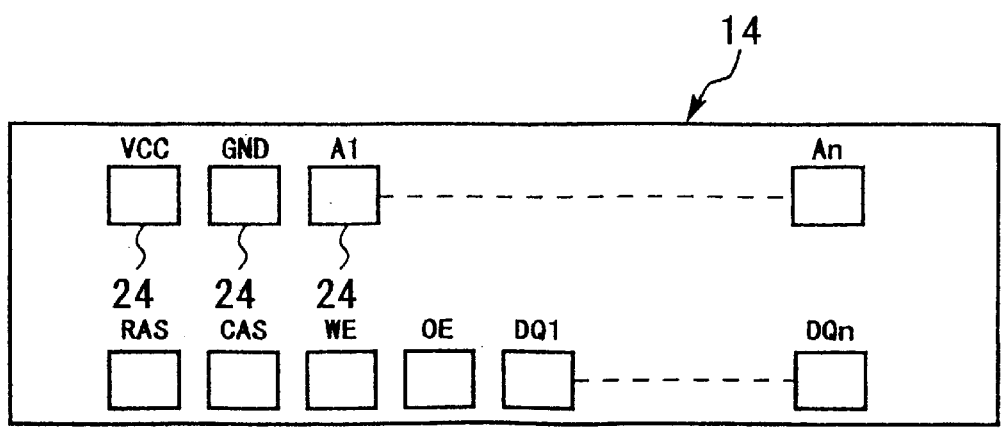
FIG. 2 is an enlarged view showing a test circuit provided on the semiconductor device shown in FIG. 1.

FIG. 2 is an enlarged view showing the test circuit 14. As shown in FIG. 2, the test circuit 14 has a plurality of input pads 24. In the first embodiment, the individual chip 12 (DRAM) comprises a power terminal VCC, a ground terminal GND, address input terminals A1 to An, a row address strobe terminal RAS, a column address strobe terminal CAS, a write enable terminal WE, an output enable terminal OE, and data terminals DQ1 to DQn. The input pads 24 of the test circuit 14 are provided so as to correspond to these terminals, respectively.

A cross-sectional structure of the semiconductor wafer 10 will now be described by reference to FIGS. 3 and 4.

Figure 3:
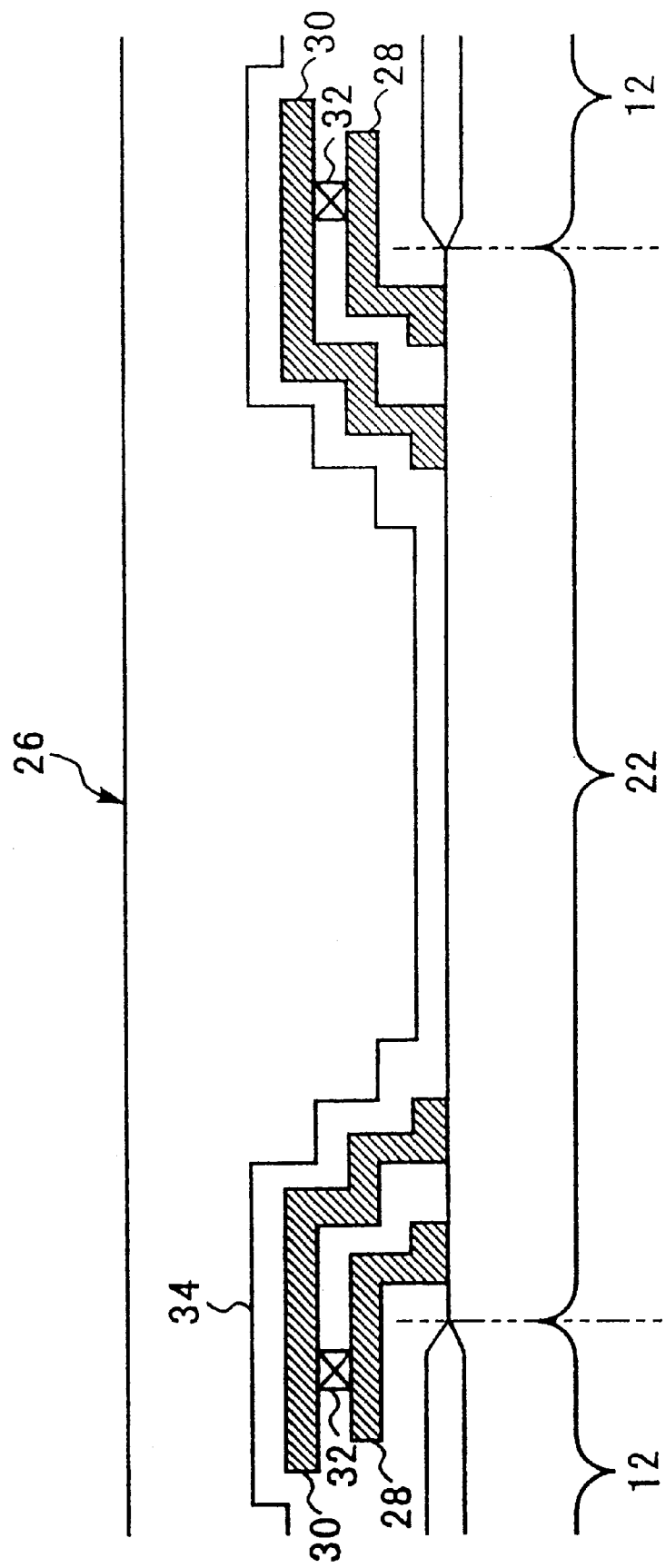
FIG. 3 is a cross-sectional view showing a semiconductor wafer to be compared with the semiconductor wafer shown in FIG. 1.

FIG. 3 is a cross-sectional view showing a semiconductor wafer 26 to be compared with the semiconductor wafer 10. The semiconductor wafer 26 shown in FIG. 3 has a common structure; namely, the wafer has only the plurality of chips 12 thereon. In general, DRAM has a two-layer wiring structure for the purpose of fulfilling its function. For this reason, the wafer 26 is provided with a first metal wiring layer 28 and a second metal wiring layer 30 formed on the first metal wiring layer 28. These wiring layers are in conduction with each other at given areas by way of through-holes 32. The first metal wiring layer 28, the second metal wiring layer 30, and the through-hole 32 are provided so as to correspond to the individual chip 12. These wiring layers are covered with a glass coat 34.

The plurality of chips 12 are formed on the semiconductor wafer 26 in such a way as to independently perform functions after they have been separated from one another along the scribe line region 22. Accordingly, the function of the chips 12 must be implemented without forming wiring patterns in the scribe line region 22. Therefore, as shown in FIG. 3, no wiring patterns are laid in the scribe line region 22 of the semiconductor wafer 26.

Figure 4:
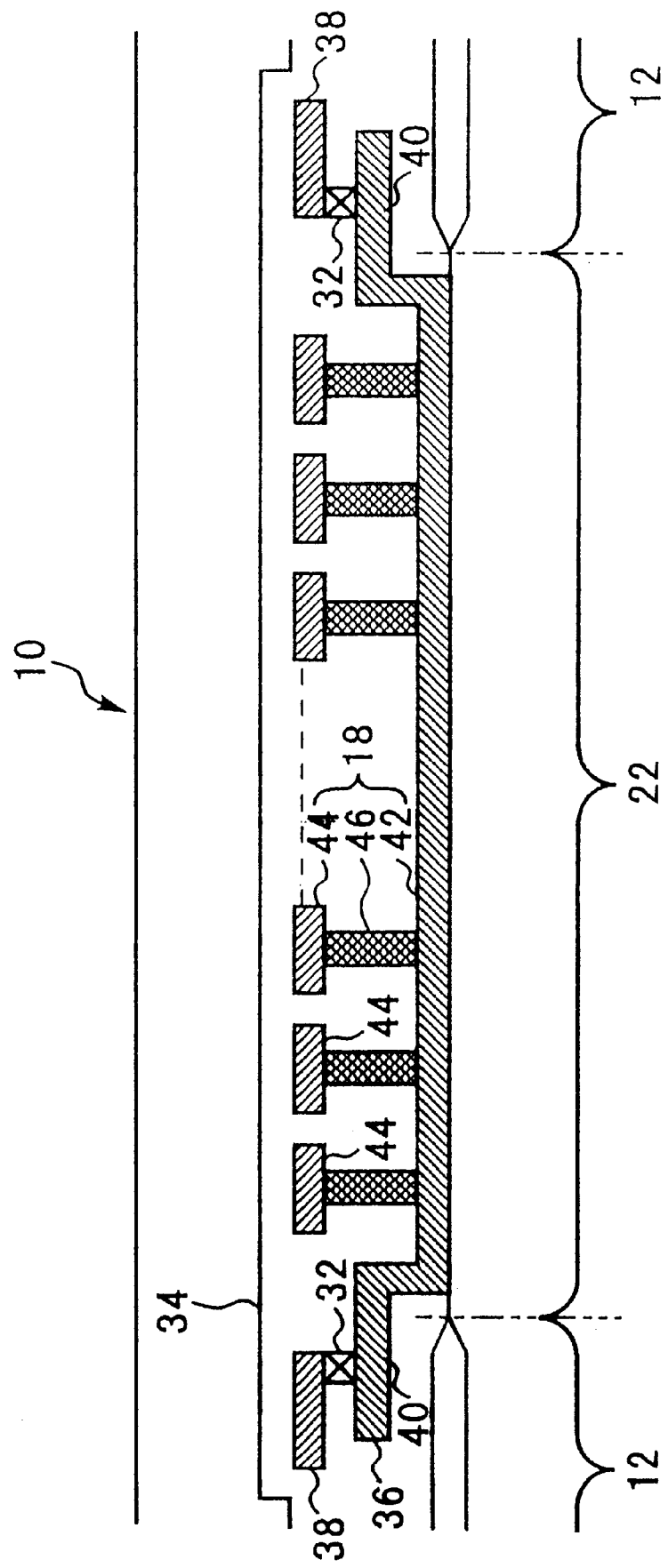
FIG. 4 is a cross-sectional view showing the semiconductor wafer shown in FIG. 1.

FIG. 4 is a cross-sectional view showing the semiconductor wafer 10 according to the first embodiment. As shown in FIG. 4, the semiconductor wafer 10 comprises a first metal wiring pattern 36, a second metal wiring pattern 38, and through-holes 32. The second metal wiring pattern 38 and the through-hole 32 are provided so as to correspond to the individual chip 12. In contrast, the first metal wiring pattern 36 is provided so as to be shared among the plurality of chips 12 provided on opposite sides of the scribe line region 22. More specifically, the first metal wiring pattern 36 has a function wiring section 40 required for fulfiling the function of the individual chip 12 and a test wiring section 42 provided so as to traverse the scribe line region 22. The test wiring section 42 is provided so as to correspond to each of the terminals (Vcc, GND, RAS, CAS, or the like) of the chip 12.

Further, a plurality of second metal wiring patterns 44 are provided in the scribe line region 22 so as to longitudinally cross the same. The second metal wiring patterns 44 are brought into conduction with the relevant first metal wiring patterns 36, i.e., the test wiring sections 42, respectively, by way of the through-holes 46. Each of the second metal wiring patterns 44 is, at its end, in conduction with one of the input pads 24 (see FIG. 2) of the test circuit 14. In other words, each of the input terminal of the individual chip 12 is in conduction with the corresponding input pad 24 by way of the foregoing test wiring section 42, second metal wiring pattern 44, and through-hole 46. In the first embodiment, the test wiring pattern 18 shown in FIG. 1 is formed from the test wiring section 42, the second metal wiring pattern 44, and the through-hole 46.

As set forth, in the first embodiment, each input pad 24 of the test circuit 14 is in conduction with each input terminal of all the chips 12. Accordingly, when any suitable test pattern signal is input to the input pads 24 of the semiconductor wafer 10, all the chips 12 can be tested simultaneously. The first embodiment outputs test results produced by the chips 12 at the corresponding output pads 16. The chips 12, therefore, can be judged to be acceptable or defective according to the information appeared at the output pads 16.

Accordingly, in the first embodiment, all the chips 12 formed on the surface of the semiconductor wafer 10 can be efficiently checked by connecting all the output pads 16 and the input pads 24 of the test circuit 14 to external equipment. The check will be referred to simply as a "multi-test" hereunder. In this test method, there is no need to establish direct contact between the output terminals of the chips 12 and the external equipment, and hence there can be reliably prevented damage of the chips 12, which would otherwise be caused by checking of the wafer 10.

In the first embodiment, the test circuit 14 and the output pads 16 are formed in the peripheral area of the semiconductor wafer 10, i.e., the area where the chips 12 are difficult to fabricate. Further, in the first embodiment, the test wiring 18 are formed through utilization of the scribe line region 22 to be provided on the semiconductor wafer 10. Accordingly, the semiconductor wafer 10 according to the first embodiment can yield the foregoing superior advantageous result without considerable reduction in a number of chips obtainable from one wafer.

During the process of manufacturing a semiconductor device which uses the semiconductor wafer 10 according to the present invention, there are performed following proceedings.

(1) A "chip fabrication process" in which the plurality of chips 12 are formed on the semiconductor wafer 10;

(2) a "multi-test circuit formation process" in which the test circuit 14, the output pads 16, and the test wiring 18 are formed on the semiconductor wafer 10;

(3) a "multi-test process" in which a multi-test is performed through use of the test circuit 14 and the output pads 16; and (4) a "separation process" in which the chips 12 are separated from one another along the scribe line region 22 after execution of the multi-test.

The foregoing semiconductor manufacturing method ensures a vast amount of chips on one wafer and enables efficient tasting of the chips 12, which result in an improvement in the productivity of the semiconductor device.

Second Embodiment

A second embodiment of the present invention will now be described by reference to FIGS. 5 and 6.

Figure 5:
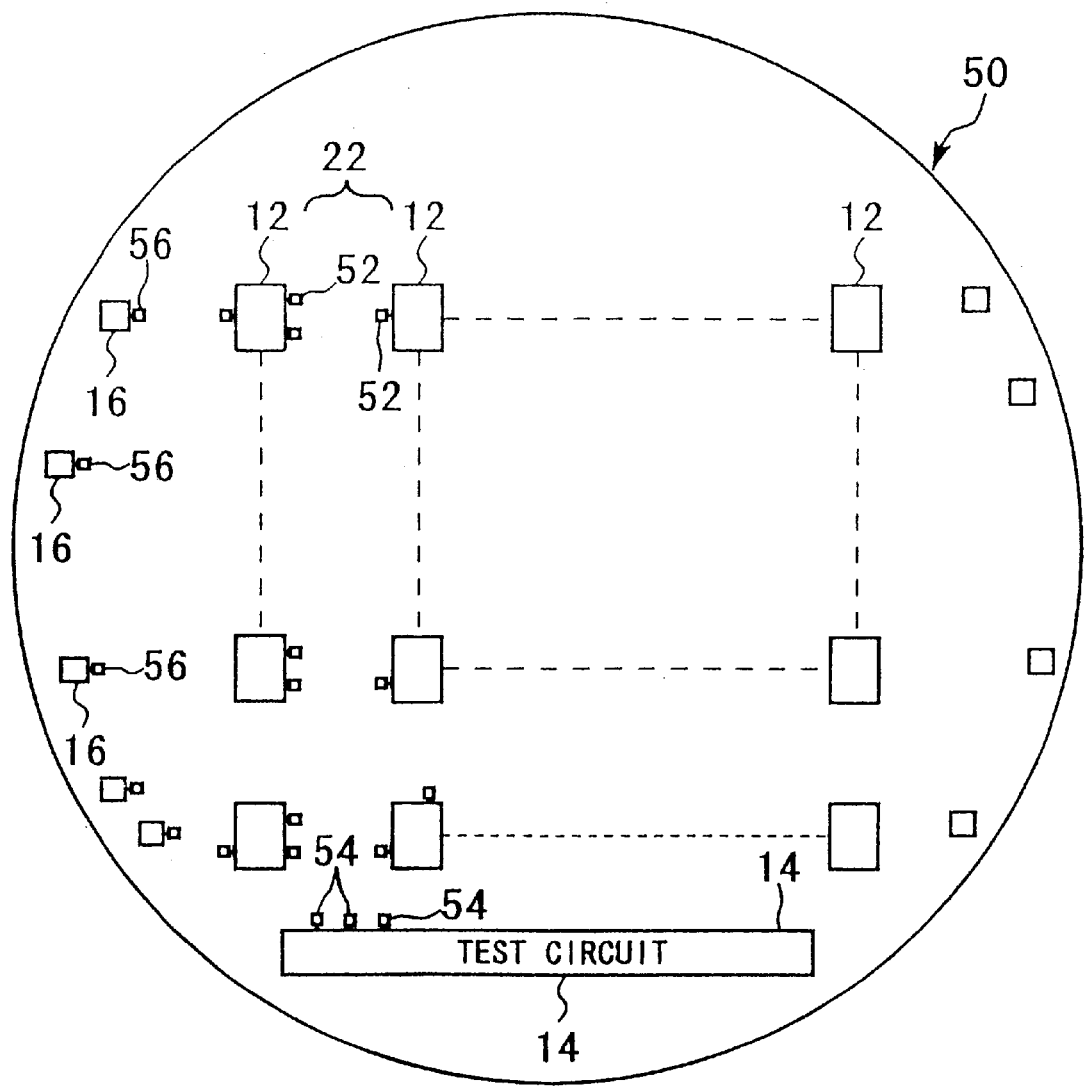
FIG. 5 is a plan view showing a semiconductor wafer according to a second embodiment of the present invention.

FIG. 5 is a plan view showing a semiconductor wafer 50 according to the second embodiment. As shown in FIG. 5, the semiconductor wafer 50 comprises connection pads 52 which establish conduction with the chips 12. The connection pads 52 are provided in the scribe line region 22 so as to establish conduction with the terminals of the chips 12. The semiconductor wafer 50 comprises connection pads 54 which establish conduction with the test circuit 14 and connection pads 56 corresponding to the output pads 16. Each of the connection pads 52 corresponding to the test circuit 14 is in conduction with each input pad 24 (see FIG. 2).

Figure 6:
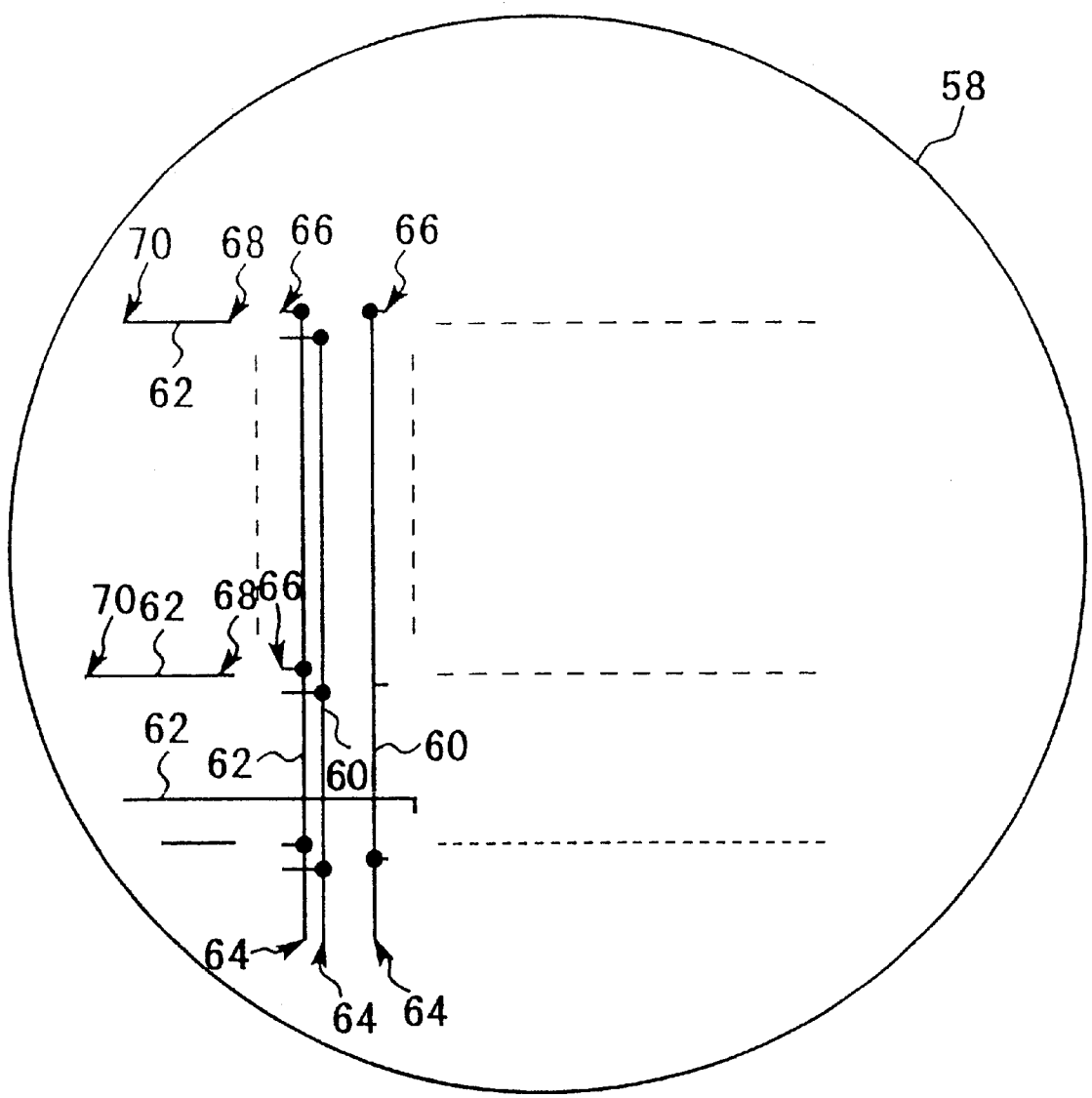
FIG. 6 is a plan view showing a test board used for a multi-test of the semiconductor wafer according to the second embodiment of the present invention.

FIG. 6 shows a test board 58 used for a multi-test of the semiconductor wafer 50 according to the second embodiment. The test board 58 is provided with a plurality of external test patterns 60 and 62. The external test patterns 60 shown in FIG. 6 are provided at the position corresponding to the scribe line region 22 of the semiconductor wafer 50. Test styluses 64 are provided at the end of the external test wiring patterns 60 for the purpose of establishing conduction with the connection pads 54 which are in conduction with the test circuit 14. In a predetermined location of the external test wiring pattern 60, test styluses 66 are provided so as to establish conduction with the connection pads 52 which are in conduction with the chips 12.

Further, a test stylus 68 for establishing connection with the connection pad 52 which is in conduction with the chip 12 is provided at one end of the external test pattern 62 shown in FIG. 6, and a test stylus 70 is provided at the other end of the external test pattern 62 for the purpose of establishing conduction with the output pad 16. The test board 58 is superimposed on the semiconductor wafer 50 in a relevant manner, whereby the test styluses 64 to 70 can be brought into contact with the contact pads 52, 54, and 56. As a result, there can be obtained a multi-test circuit analogous to that formed on the semiconductor wafer 10 according to the first embodiment. Accordingly, the semiconductor wafer 50 and the test board 58 according to the second embodiment ensure a vast amount of chips on one wafer and enable the efficient multi-test targeting all the chips 12, as in the case of the first embodiment.

As mentioned above, the second embodiment does not require formation of test patterns on the semiconductor wafer 50. The semiconductor wafer 50, therefore, can be manufactured more efficiently compared with the semiconductor wafer 10 according to the first embodiment. Further, in the second embodiment, the connection pads 52 to be brought into contact with the test styluses 66 and 68 of the test board 58 are provided in the scribe line region 22 and are removed during the process of manufacturing the semiconductor device.

In other words, the damage inflicted on the connection pads 52 of the semiconductor wafer 50 does not remain as damage to the chips 12. Accordingly, as in the case of the first embodiment, the semiconductor device practiced as the second embodiment reliably prevents the damage of the chips 12, which would otherwise be caused by execution of the multi-test.

During the process of manufacturing a semiconductor device which uses the semiconductor wafer 50 according to the present invention, there are performed following proceedings.

(1) A "chip fabrication process" in which the plurality of chips 12 are formed on the semiconductor wafer 50;

(2) a "multi-test circuit formation process" in which the test circuit 14, the output pads 16, and the connection pads 52 to 56 are formed on the semiconductor wafer 50;

(3) a "multi-test process" in which the test board 58 having the external test patterns 60 and 62 is placed on the semiconductor wafer 50 in such a way as to establish continuity between the external test patterns 60 and 62 and the connection pads 52 to 56, and the multi-test is performed through use of the test circuit 14 and the output pads 16; and (4) a "separation process" in which the chips 12 are separated from one another along the scribe line region 22 after execution of the multi-test.

The foregoing semiconductor manufacturing method ensures a vast amount of chips on one wafer and enables efficiency testing of the chips 12, which result in an improvement in the productivity of the semiconductor device. Although in the second embodiment a multi-test is performed through use of the test board 58 having the external test patterns 60 and 62 that is superimposed on the semiconductor wafer 50, the present invention is not limited to such a test. The multi-test may be performed through use of a test film having the external test patterns 60 and 62 that is affixed to the semiconductor wafer 50.

Third Embodiment

A third embodiment of the present invention will now be described by reference to FIGS. 7 through 9.

Figure 7:
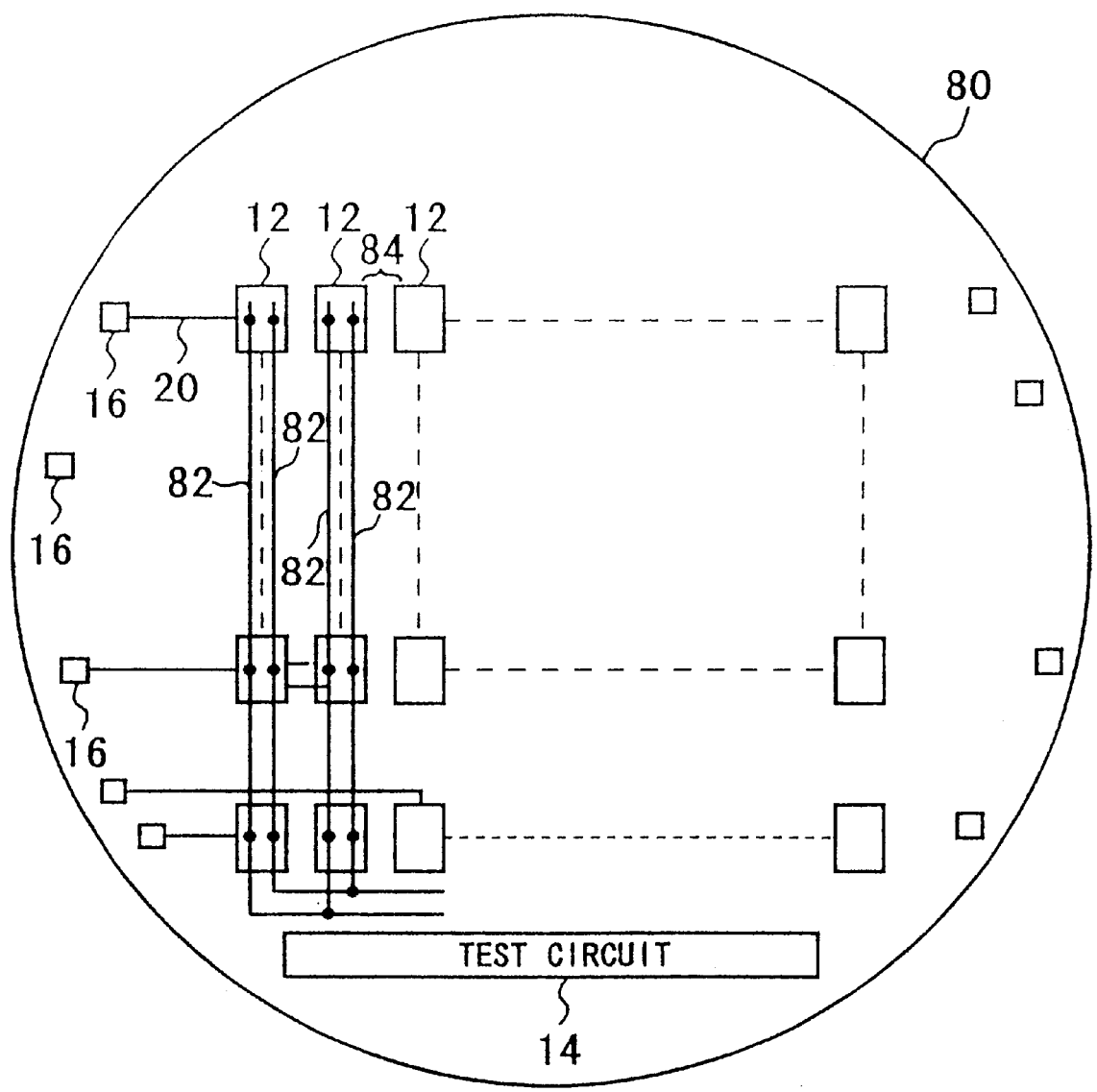
FIG. 7 is a plan view showing a semiconductor wafer according to a third embodiment of the present invention.

FIG. 7 is a plan view showing a semiconductor wafer 80 according to the third embodiment. As shown in FIG. 7, the semiconductor wafer 80 has a plurality of upper test patterns 82 for connecting the test circuit 14 to all the chips 12. The upper test patterns 82 are disposed so as to be superimposed on the chips 12, i.e., in the position where dicing line regions 84 are not utilized.

In the semiconductor wafer 80 according to the third embodiment, since the upper test patterns 82 are formed without utilization of the dicing line region 84, the width of the dicing line region 84 may be decreased so as to be smaller than that of the dicing line region used in the first and second embodiments. Consequently, the semiconductor wafer 80 according to the third embodiment can ensure a larger amount of chips thereon compared with the semiconductor wafers 10 and 50 according to the first and second embodiments.

Figure 8:
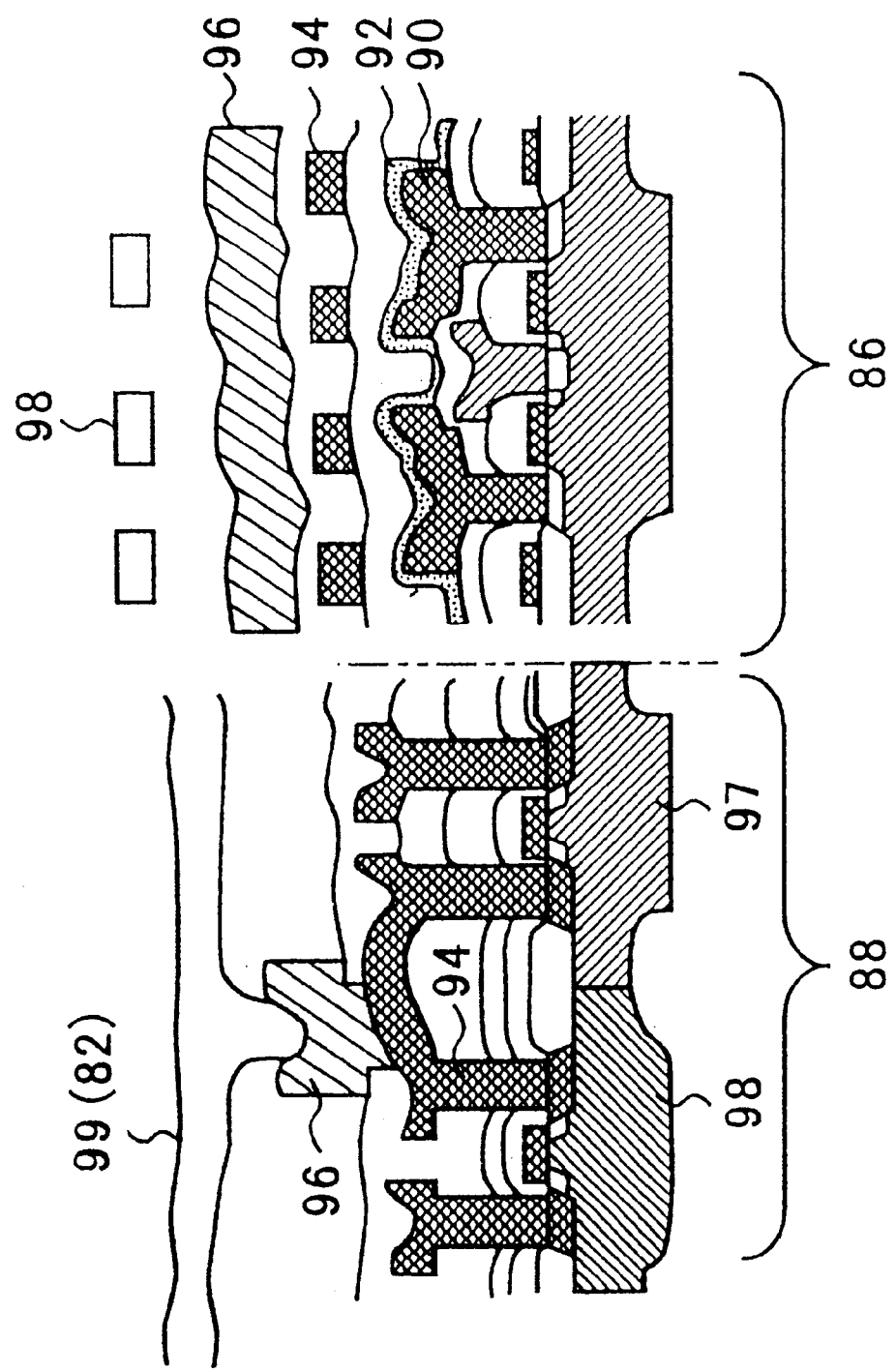
FIG. 8 is an enlarged view showing the principal elements of chips provided on the semiconductor wafer shown in FIG. 7.

FIG. 8 is an enlarged view showing the principal elements of the chips 12 formed on the semiconductor wafer 80. As shown in FIG. 8, the chip 12 comprises a memory cell 86 and a control circuit 88. In the memory cell 86, a first metal wiring pattern 94 is formed above a storage node 90 and a cell plate 92. Further, a second metal wiring pattern 96 is formed above the first metal wiring pattern 94. Likewise, in the control circuit 88, the first metal wiring pattern 94 and the second metal wiring pattern 96 are formed above a P-type region 97 or above an N-type region 98. The first and second metal wiring patterns 94 and 96 are required to fulfill the function of DRAM.

As shown in FIG. 8, a third metal wiring pattern 99—which establishes continuity with the second metal wiring pattern 96 in the control circuit 88—is formed above the second metal wiring pattern 96. The third metal wiring pattern 99 is provided so as to correspond to the individual terminals (VCC, GND, RAS, CAS, or the like) of the chip 12. The upper test pattern 82 shown in FIG. 7 is formed from the third metal wiring pattern 99 shown in FIG. 8. In the third embodiment, the input pad 24 of the test circuit 14 is connected to all the chips 12 in a relevant manner by means of the third metal wiring pattern 99 (i.e., the upper test pattern 82).

Figure 9:
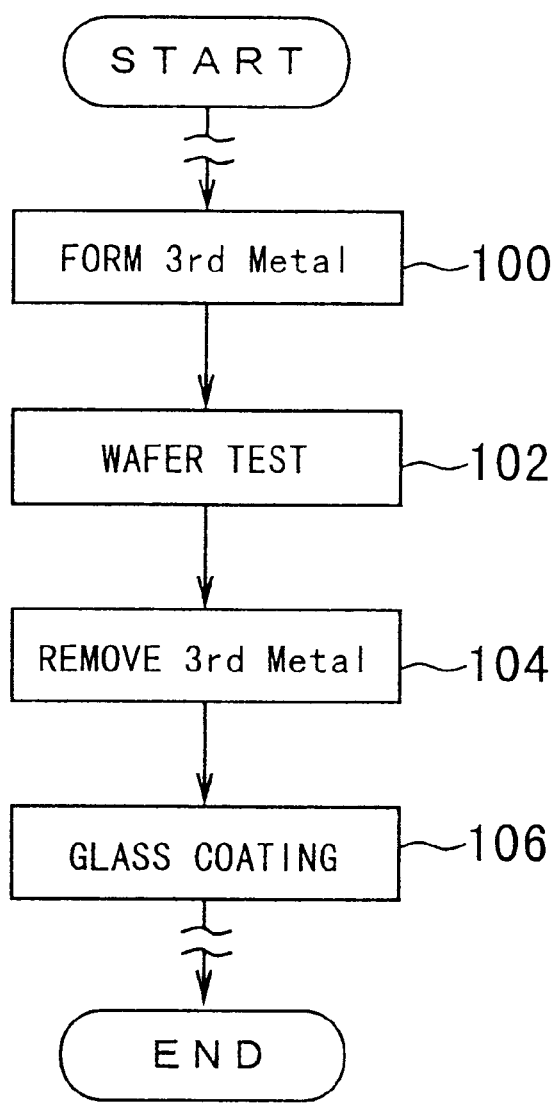
FIG. 9 is a flowchart showing a series of processing operations performed under the method of manufacturing a semiconductor device through use of the semiconductor wafer shown in FIG. 7.

FIG. 9 is a flowchart showing a series of processing operations to be performed under the manufacturing method through use of the semiconductor device 80 according to the third embodiment. Processing in step 100 shown in FIG. 9 is performed after formation of the first and second metal wiring patterns 94 and 96 on the semiconductor wafer 80.

In step 100, the third metal wiring pattern 99—which functions as the upper test pattern 82—is formed on the semiconductor wafer 80 in the manner as mentioned previously. As a result of the processing in step 100, the input pad 24 of the test circuit 14 is brought into conduction with all the chips 12 as well as all the chips 12 being brought into conduction with the corresponding output pads 16.

In step 102, a wafer is checked through use of the test circuit 14 and the output pads 16, namely, all the chips 12 are subjected to a multi-test. The processing in step 102 enables efficient multi-testing of all the chips 12.

In step 104, the third metal wiring pattern 99 (i.e., the upper test pattern 82) is removed from the semiconductor wafer 80. As a result of the processing in step 104, the wiring—which is not required for the function of the chip 12—is removed from the position above the chip 12.

In step 106, the first and second metal wiring patterns 94 and 96 are covered with a glass coat required for covering the wiring patterns 94 and 96. After the foregoing operations, predetermined proceedings such as separation of the chips 12 along the scribe line regions 84 are performed so that semiconductor devices are manufactured.

As mentioned above, the semiconductor wafer 80 and the semiconductor manufacturing method according to the third embodiment ensure a vast amount of chips 12 on the wafer 80 and enables efficient testing of all the chips 12 during the manufacturing process of a semiconductor device. Under the manufacturing method according to the third embodiment, the upper test patterns 82 are removed after multi-test so that unneeded wiring patterns can be eliminated at the time of completion of the semiconductor device. Accordingly, the semiconductor device manufacturing method according to the third embodiment enables high-yield manufacture of a semiconductor device of stable quality.

Fourth Embodiment

A fourth embodiment of the present invention will now be described by reference to FIG. 10.

Figure 10:
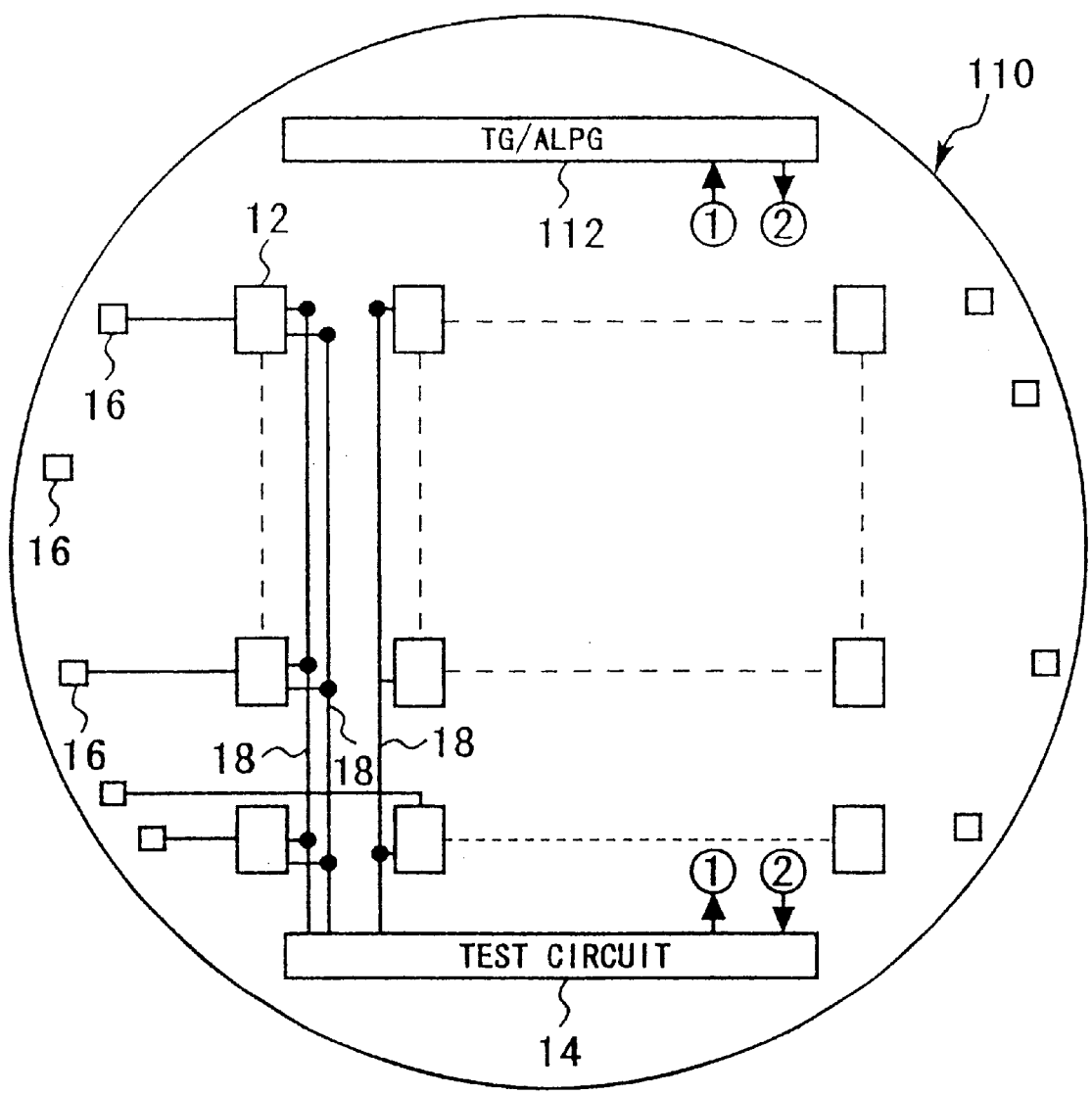
FIG. 10 is a plan view showing a semiconductor wafer according to a fourth embodiment of the present invention.

FIG. 10 is a plan view showing a semiconductor wafer 110 according to the fourth embodiment. The semiconductor wafer 110 according to the fourth embodiment comprises a plurality of chips 12, a single test circuit 14, a plurality of output pads 16, and a plurality of test wiring patterns 18 as with the semiconductor wafer 10 according to the first embodiment. As shown in FIG. 10, the semiconductor wafer 110 is characterized by comprising a target generator/algorithm pattern generator (TG/ALPG) 112 in addition to the previously-described constituent elements.

The TG/ALPG 112 is in conduction with the predetermined input pads 24 of the test circuit 14. Upon receipt of a predetermined input signal fed to the test circuit 14 from the external equipment, the TG/ALPG 112 determines a test cycle or generates either a timing edge for the purposes of waveform shaping or a strobe pulse signal for the purpose of specifying timing for output comparison; namely, the TG/ALPG 112 serves as a timing generator. Further, the TG/ALPG 112 has the function of generating a signal pattern required for testing the chips 12 while the chips still remain on the semiconductor wafer 10; more specifically, the TG/ALPG 112 serves as an algorithm pattern generator.

In the fourth embodiment, when a predetermined signal is fed to the test circuit 14 from the external equipment, the TG/ALPG 112 produces signals required for performing a multi-test such as a timing edge, a strobe pulse signal and pattern signals. These signals generated by the TG/ALPG 112 are supplied to the predetermined input pads 24 of the test circuit 14. Subsequently, the signals are supplied to all the chips 12 by way of the test wiring 18. Thus, regarding the semiconductor wafer 110 according to the fourth embodiment, all the chips 12 can be efficiently subjected to a multi-test by supplying only a simple signal to the test circuit 14.

Fifth Embodiment

A fifth embodiment of the present invention will now be described by reference to FIG. 11.

Figure 11:
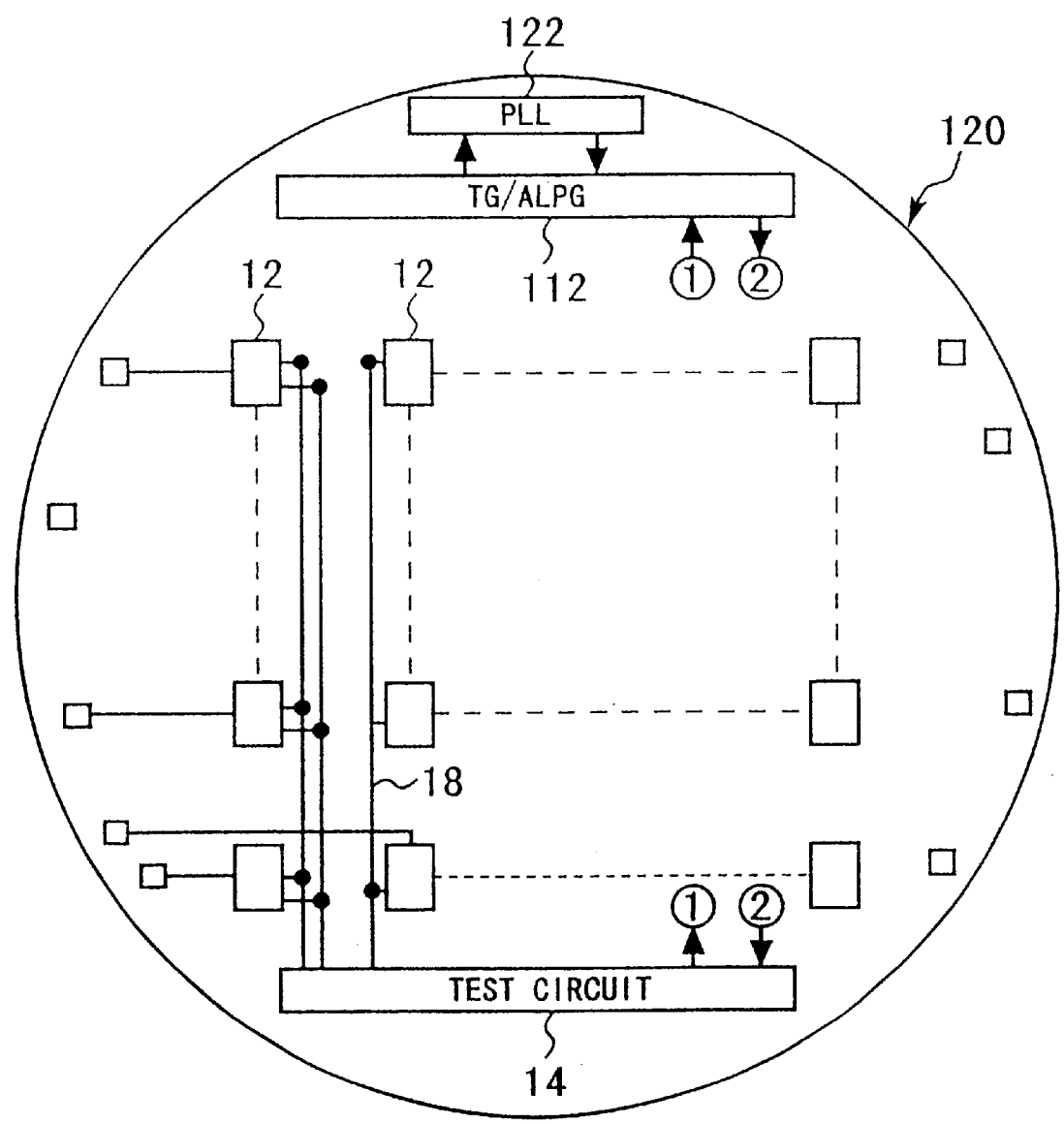
FIG. 11 is a plan view showing a semiconductor wafer according to a fifth embodiment of the present invention.

FIG. 11 is a plan view showing a semiconductor wafer 120 according to the fifth embodiment. The semiconductor wafer 120 is characterized by comprising a phase lock loop (PLL) circuit in addition to the constituent elements of the semiconductor wafer 110 according to the fourth embodiment.

The PLL circuit 122 is brought into conduction with the TG/ALPG 112 and receives a reference clock signal produced by an external equipment or the TG/ALPG 112. Further, the PLL circuit 122 receives the output signal of the TG/ALPG 112 as well as the test circuit 14. Upon receipt of such signals, the PLL circuit 122 controls an oscillation frequency of the output signal of the TG/ALPG 112 so as to match an oscillation frequency of the reference clock signal; i.e., the standard oscillation frequency.

As a result of the PLL circuit 122 functioning in the manner as mentioned previously, there can be reliably prevented skew of the test pattern signal supplied to all the chips 12 by way of the test circuit 14, i.e., a deviation of oscillation frequency of the test pattern signal from the standard oscillation frequency. Thus, regarding the semiconductor wafer 120 according to the fifth embodiment, all the chips 12 can be readily and accurately checked by a multi-test by supplying only a simple signal to the test circuit 14.

Although in the first through fifth embodiments the semiconductor wafers 10, 50, 80, 110, and 120, are provided with the chips 12 serving as DRAM, the present invention is not limited to these embodiments. The wafers may be provided with chips fulfilling other functions.

The major benefits of the present invention described above are summarized as follows:

According to a first aspect of the present invention, a desired signal can be supplied to input terminals of a plurality of chips by bringing a test stylus into contact with a test circuit formed in the peripheral area of a semiconductor wafer. Further, signals output from the plurality of chips can be detected by bringing test styluses into contact with output pads formed in the peripheral area of the semiconductor wafer. Therefore, according to the present invention, a plurality of chips can be efficiently checked without the chips being damaged.

According to a second aspect of the present invention, test patterns required for establishing continuity between the test circuit and the chips are provided on a scribe line region, and hence the surface area of the wafer can be effectively utilized. Accordingly, the present invention effectively prevents a reduction of obtainable chips on a wafer, which would otherwise be caused by formation of a multi-test circuit.

According to a third aspect of the present invention, in a case where there is required continuity between the test circuit and the chips through use of external test patterns, the continuity can be ensured by bringing test styluses into contact with connection pads provided in the scribe line region of a wafer. Accordingly, the present invention protects the chips from damage while using the external test patterns.

According to a fourth aspect of the present invention, test patterns are provided above wiring patterns required for the functions of the chips so as to establish contact between the test circuit and the chips. In this case, there is no need to provide a space for the test patterns in the dicing line region, and hence there can be minimized a reduction in the number of obtainable chips, which would otherwise be caused by formation of a multi-test circuit on the wafer.

According to a fifth aspect of the present invention, since a timing generator and an algorithm pattern generator are formed on a semiconductor wafer, a test pattern required for testing the chips provided on the semiconductor wafer can be produced on the wafer. The present invention, therefore, enables a plurality of chips to be efficiently checked by supply of only a simple signal to the semiconductor wafer from the external equipment.

According to a sixth aspect of the present invention, since a PLL circuit is formed on a semiconductor wafer, there can be effectively prevented a deviation of oscillation frequency between a standard signal and a signal produced on the semiconductor wafer and supplied to chips. More particularly, the present invention can efficiently prevent skew of the signal supplied to the chips.

According to a seventh aspect of the present invention, after formation of a test circuit and output pads in the peripheral area of the semiconductor wafer, a plurality of chips can be checked through use of the test circuit and the output pads. By means of the foregoing technique, a vast amount of chips can be provided on a single semiconductor wafer, and the plurality of chips can be efficiently checked. Accordingly, the present invention enables an improvement in productivity of the semiconductor device.

According to an eighth aspect of the present invention, conductivity required for a multi-test can be obtained by formation of test patterns in a scribe line region. Thus, the present invention ensures a vast amount of chips on a single semiconductor wafer and allows high-productivity manufacture of the semiconductor device.

According to a ninth aspect of the present invention, connection pads are provided in a scribe line region, and a multi-test can be performed through use of the connection pads and external test patterns. In this case, since there is no need to provide test patterns on the semiconductor wafer, the productivity of a semiconductor device can be improved to a much greater extent.

According to a tenth aspect of the present invention, a multi-test can be performed through use of upper test patterns formed on the wiring patterns required for the functions of chips. Since the upper test patterns are removed after performance of the multi-test, unneeded wiring patterns are prevented from remaining on the chips. The foregoing semiconductor device manufacturing method ensures a vast amount of chips on a single semiconductor wafer and enables an improvement in the productivity of the semiconductor device without involving any inconvenience.

Further, the present invention is not limited to these embodiments, but variations and modifications may be made without departing from the scope of the present invention.

The entire disclosure of Japanese Patent Application No. Hei10-203918 filed on Jul. 17, 1998 including specification, claims, drawings and summary are incorporated herein by reference in its entirety.

What is claimed is:

1. A semiconductor wafer comprising:
   a plurality of chips formed on a surface of the semiconductor wafer; and
   a multi-test circuit for testing the plurality of chips formed on the surface of the semiconductor wafer, spaced apart from the plurality of chips, the multi-test circuit including:
      a test circuit including input pads connected to terminals of the plurality of chips, and
      a plurality of output pads connected to respective output terminals of the plurality of chips,
   wherein the test circuit and the output pads are provided in a peripheral area of the surface of the semiconductor wafer.

2. The semiconductor wafer as defined in claim 1, further comprising test patterns for connecting the test circuit to the plurality of chips in a scribe line region provided between the plurality of chips.

3. The semiconductor wafer as defined in claim 1, further comprising connection pads provided in a scribe line region provided between the plurality of chips,
   wherein said connection pads may be brought into contact with external test patterns which are used for establishing connection between the test circuit and the plurality of chips.

4. The semiconductor wafer as defined in claim 1, further comprising upper test patterns provided above wiring patterns required for the functions of the chips, said upper test patterns connecting the test circuit to the plurality of chips.

5. The semiconductor wafer as defined in claim 1, further comprising:
   a timing generator for producing a timing signal required for testing the plurality of chips; and
   an algorithm pattern generator for generating a signal pattern required for testing the plurality of chips.

6. The semiconductor wafer as defined in claim 5, further comprising a PLL circuit which locks the oscillation frequency of the signal supplied to the plurality of chips on the standard oscillation frequency.

* * * * *